United States Patent
Shi et al.

(10) Patent No.: US 7,081,787 B2
(45) Date of Patent: Jul. 25, 2006

(54) ANALOG CIRCUIT FOR CALCULATING SQUARE AND RECIPROCAL OF A CURRENT

(75) Inventors: Bingxue Shi, Beijing (CN); Jiwei Chen, Beijing (CN)

(73) Assignee: Winbond Electronics Corp., Hsinchu (TW)

( * ) Notice: Subject to any disclaimer, the term of this patent is extended or adjusted under 35 U.S.C. 154(b) by 127 days.

(21) Appl. No.: 10/949,172

(22) Filed: Sep. 24, 2004

(65) Prior Publication Data

US 2006/0066390 A1    Mar. 30, 2006

(51) Int. Cl.
*G05F 1/10* (2006.01)
(52) U.S. Cl. ........................ 327/538; 327/349
(58) Field of Classification Search ................ 323/315, 323/316; 327/346, 349, 530, 534, 535, 537, 327/538, 539, 540, 541, 543
See application file for complete search history.

(56) References Cited

U.S. PATENT DOCUMENTS

| | | | | |
|---|---|---|---|---|
| 5,485,119 A | * | 1/1996 | Kimura | 330/253 |
| 6,107,858 A | * | 8/2000 | Kimura | 327/349 |

* cited by examiner

*Primary Examiner*—Jeffrey Zweizig
(74) *Attorney, Agent, or Firm*—J.C. Patents

(57) ABSTRACT

An analog circuit for calculating square and reciprocal of a current is provided. It is an analog integrated circuit and can make the input and output signals become currents in the current field of the same type of analog integrated circuit. The output current can be the square or reciprocal of the input current. The square and reciprocal functions can be implemented by using three identical BJTs. Those three BJTs are independent and the bases and collectors of the BJTs are coupled to ground. Hence, the circuit can be implemented by the standard CMOS and can be applied to the other complicated system. In addition, the operational amplifier and the capacitor in the circuit are required to stabilize this circuit. This circuit has a simple structure.

8 Claims, 4 Drawing Sheets

US 7,081,787 B2

ANALOG CIRCUIT FOR CALCULATING SQUARE AND RECIPROCAL OF A CURRENT

BACKGROUND OF THE INVENTION

1. Field of the Invention

This invention generally relates to a circuit for calculating square and reciprocal of a current, and more particularly to an analog circuit for calculating square and reciprocal of a current.

2. Description of Related Art

As the digital signal processing and IC technologies have been developed in the past 30 years, the analog IC technology, like the digital IC technology, is also significantly developed. Because of the demand, the analog IC would never be out-of-fashion.

Compared to the digital technology, some operations can be performed better by the analog technology and the cost is lower. The required power is also lower. In addition, the analog IC design, using the current mode, almost always performs faster than that using the traditional voltage mode.

In the present invention, an analog circuit which can calculate square and reciprocal of a current mode is disclosed. Such a circuit can be implemented by the complementary metal-oxide semiconductor (CMOS). The design of that circuit is simple but effective.

SUMMARY OF THE INVENTION

The present invention is directed to an analog circuit for calculating square and reciprocal of a current, comprising a first PMOS transistor, a second PMOS transistor, a third PMOS transistor, a first PNP BJT, a second PNP BJT, a third PNP BJT, a high gain differential operational amplifier, a first current source and a second current source. The first PMOS transistor comprises a drain, a gate and a source wherein the gate of the first PMOS transistor is coupled to a ground terminal. The second PMOS transistor comprises a drain, a gate and a source, wherein the source of the second PMOS transistor is coupled to the drain of the first PMOS transistor, the gate of the second PMOS transistor is coupled to the gate of the first PMOS transistor and to the ground terminal. The first PNP BJT comprises an emitter, a base and a collector, wherein the base and the collector of the first PNP BJT are coupled to the ground terminal and the emitter of the first PNP BJT is coupled to the source of the first PMOS transistor. The second PNP BJT comprises an emitter, a base and a collector, wherein the base and the collector of the second PNP BJT are coupled to the ground terminal. The third PNP BJT comprises an emitter, a base and a collector, wherein the base and the collector of the third PNP BJT is coupled to the ground terminal and the emitter of the third PNP BJT is coupled to drain of the second PMOS transistor. The high gain differential operational amplifier comprises a positive input terminal, a negative input terminal and an output terminal, wherein the positive input terminal is coupled to the source of the second PMOS transistor and the negative input terminal is coupled to the emitter of the second PNP BJT. The third PMOS transistor comprises a drain, a gate and a source, wherein the drain of the third PMOS transistor is coupled to the drain of the second PMOS transistor and the gate of the third PMOS transistor is coupled to the output terminal of the high gain differential operational amplifier. The first current source is coupled to the source of the first PMOS transistor and the source of the third PMOS transistor. The second current source is coupled to the emitter of the second PNP BJT and the source of the third PMOS transistor.

In an embodiment of the present invention, the analog circuit further comprises a first capacitor and a fourth PMOS transistor. The first capacitor comprises a first terminal and a second terminal, wherein the first and second terminals of the first capacitor are coupled to the source and the drain of the second PMOS transistor respectively to reduce an unexpected vibration. The fourth PMOS transistor comprises a drain, a gate and a source, wherein the source of the fourth PMOS transistor is coupled to the source of the third PMOS transistor and the gate of the fourth PMOS transistor is coupled to the gate of the third PMOS transistor.

In an embodiment of the present invention, an output current from the drain of the fourth PMOS transistor reflects from an output current from the drain of the third PMOS transistor based on a specific ratio factor.

In an embodiment of the present invention, the first current source is 10 µA. The second current source ranges from about 5 µA to 15 µA. The output current from the drain of the fourth PMOS transistor is substantially equal to (the second current source)$^2$/10 µA.

In an embodiment of the present invention, the second current source is 10 µA. The first current source ranges from about 5 µA to 15 µA. The output current from the drain of the fourth PMOS transistor is substantially equal to (10 µA)$^2$/the second current source.

According to an embodiment of the present invention, the high gain differential operational amplifier comprises a fifth PMOS transistor, a sixth PMOS transistor, a seventh PMOS transistor, a eight PMOS transistor, a first long channel transistor, a second long channel transistor, a third long channel transistor, a first capacitor and a second capacitor. The fifth PMOS transistor comprises a drain, a gate and a source, wherein the gate of the fifth PMOS transistor is coupled to the negative input terminal of the high gain differential operational amplifier. The sixth PMOS transistor comprises a drain, a gate and a source, wherein the gate of the sixth PMOS transistor is coupled to the positive input terminal of the high gain differential operational amplifier and the source of the sixth PMOS transistor is coupled to the source of the fifth PMOS transistor. The seventh PMOS transistor comprises a drain, a gate and a source, wherein the drain of the seventh PMOS transistor is coupled to the source of the fifth PMOS transistor. The eighth PMOS transistor comprises a drain, a gate and a source, wherein the gate of the eighth PMOS transistor is coupled to the gate of the seventh PMOS transistor, the source of the eighth PMOS transistor is coupled to the source of the seventh PMOS transistor and the drain of the eighth PMOS transistor is coupled to the output terminal of the high gain differential operational amplifier. The first long channel transistor comprises a drain, a gate and a source, wherein the source of the first long channel transistor is coupled to the ground and the drain of the first long channel transistor is coupled to the gate of the first long channel transistor and to the drain of the fifth PMOS transistor. The second long channel transistor comprises a drain, a gate, and a source, the gate of the second long channel transistor being coupled to the gate of the first long channel transistor, wherein the source of the second long channel transistor is coupled to the ground and the drain of the second long channel transistor is coupled to the source of the sixth PMOS transistor. The third long channel transistor comprises a drain, a gate and a source, wherein the gate of the third long channel transistor is coupled to the drain of the second long channel transistor, the source of the third long channel transistor is coupled to the ground and the drain of the third long channel transistor is coupled to the drain of the eighth PMOS transistor. The resistor comprises a first terminal and a second terminal, wherein the first terminal of the resistor is coupled to the drain of the second long channel transistor. The second capacitor comprises a first terminal and a second terminal, wherein the first terminal of the second capacitor being coupled to the resistor, the second terminal of the second capacitor is coupled to the drain of the third long channel transistor.

In an embodiment of the present invention, the resistor and the capacitor are adapted for frequency compensation to stabilize the high gain differential operational amplifier. The first, second, and third long channel transistors are adapted for reducing the mismatch and offset.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 1:
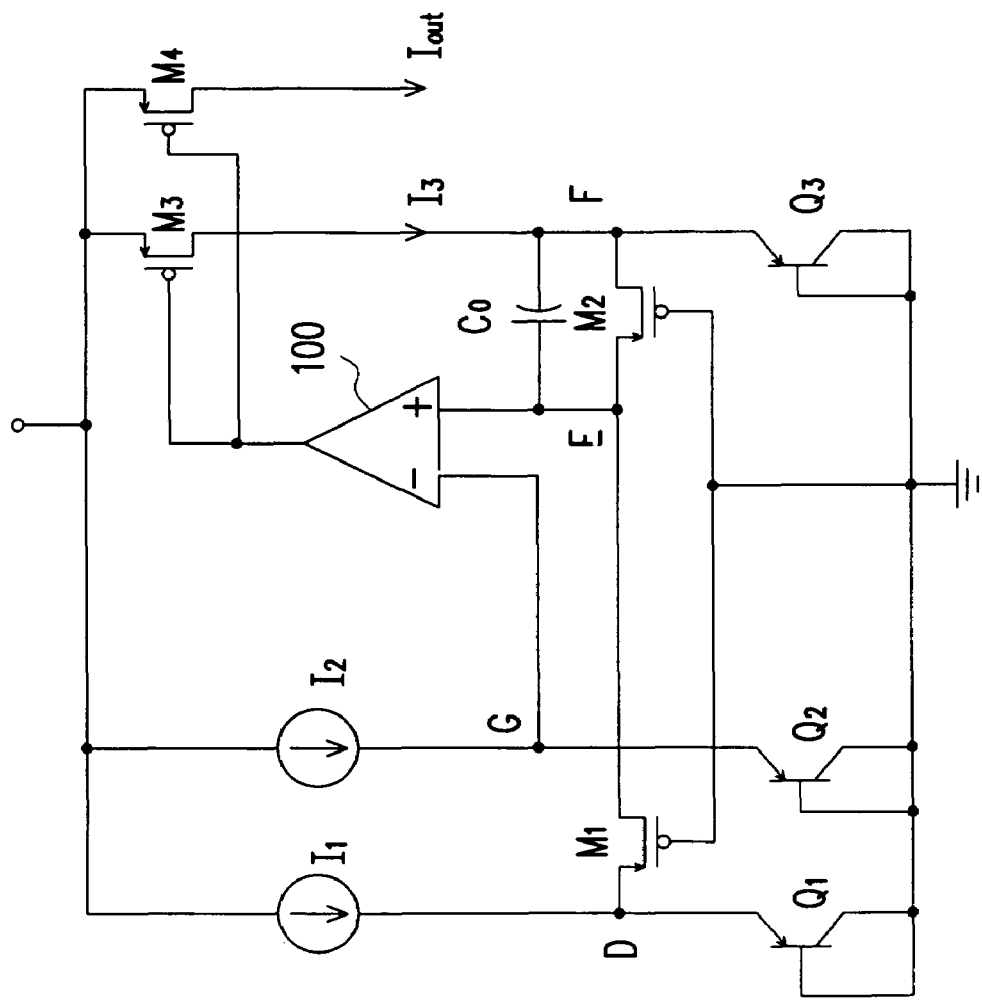
FIG. 1 is a view showing an analog circuit for calculating square and reciprocal of a current.

FIG. 1 is a view showing an analog circuit for calculating square and reciprocal of a current. Referring to FIG. 1, the analog circuit comprises three PNP BJTs Q1, Q2, and Q3, four PMOS transistors M1, M2, M3, and M4 are four PMOS transistors, a capacitor C0 and a high gain current differential operational amplifier 100.

The collector current of a BJT can be presented as follows:

$$I_C = I_S \exp(V_{BE}/V_T) \tag{1}$$

Wherein $V_T = \dfrac{KT}{q}$;

T represents the absolute temperature; K represents the Boltzmann constant; $I_s$ represents the saturated current. PMOS transistors M1 and M2 have the same channel length and are used as the resistors with high resistance. The equivalent resistance of the PMOS transistors M1 and M2 are also the same. Because the equivalent resistance of the PMOS transistors M1 and M2 are very high, the current flowing through them is negligible. In addition, compared to the collector current or the emitter current, the base current of the BJT is very small and is also negligible. Hence, the collector currents of the PNP BJT Q1, Q2, and Q3 are currents I1, I2, and I3 respectively. According to the formula (1), the voltages of the nodes D, G and F can be represented as follows:

$$V_D = V_T \ln\left(\dfrac{I_1}{I_S}\right) \tag{2}$$

$$V_G = V_T \ln\left(\dfrac{I_2}{I_S}\right) \tag{3}$$

$$V_F = V_T \ln\left(\dfrac{I_3}{I_S}\right) \tag{4}$$

The voltage of the node E, calculated based on the voltages of nodes D and F through the resistor divider consisting of the PMOS transistors M1 and M2, is represented as follows:

$$V_E = \dfrac{1}{2}(V_D + V_F) \tag{5}$$

The high gain operational amplifier will force the voltage $V_E$ equal to the voltage $V_G$. For example, $$V_T \ln\left(\dfrac{I_2}{I_S}\right) = \dfrac{1}{2}\left[V_T \ln\left(\dfrac{I_1}{I_S}\right) + V_T \ln\left(\dfrac{I_3}{I_S}\right)\right] \tag{6}$$

From the formula (6), one can obtain $$I_3 = \dfrac{I_2^2}{I_1} \tag{7}$$

Hence, if the current I1 is fixed, the current I3 is the square of the current I2; if the current I2 is fixed, the current I3 is the reciprocal of the current I1. The PMOS transistors M3 and M4 are a current reflector. This current reflector uses a specific ratio factor to reflect the output current to the other circuit. If the aspect ratio of the PMOS M4 to the aspect ratio of the PMOS M3 is α, then the output current can be represented as follows:

$$I_{out} = \alpha \dfrac{I_2^2}{I_1} \tag{8}$$

The capacitor C0 is used for reducing any unexpected vibration.

Figure 2:
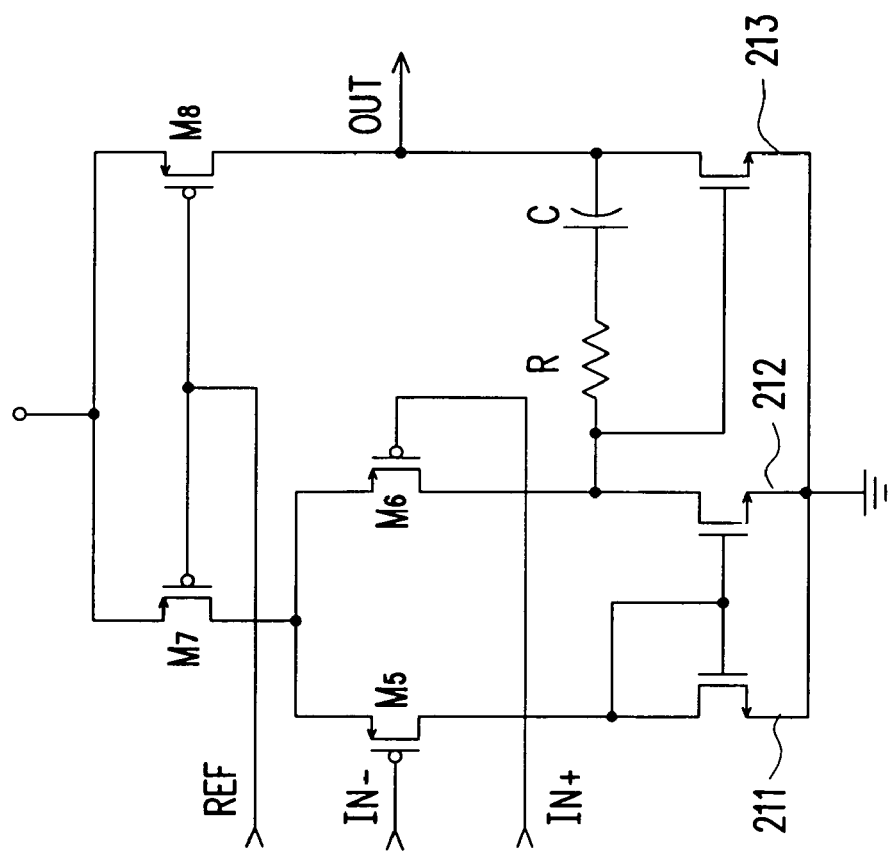
FIG. 2 is a view showing an internal circuit of an operational amplifier.

The operational amplifier of FIG. 1 is shown in FIG. 2. Considering the ordinary mode, the input voltage is as low as the voltage $V_{BE}$. PMOS differential pair is used as the input stage. The two-stage enlarged current source would make the operational amplifier have enough gain if the enlarged current source is tolerable. The resistor R and the capacitor C are used for frequency compensation to make sure that the operational amplifier 100 is stable. In addition, the long channel transistors 211–213 are adapted for reducing the mismatch and offset.

The circuit is designed and simulated by a 0.8 μm CMOS mixed signal process and a 1.8V voltage is supplied to verify the design. All devices can be implemented via the foundry. The PNP BJT in this design is formed based on a P+/N well/P substrate.

Figure 3:
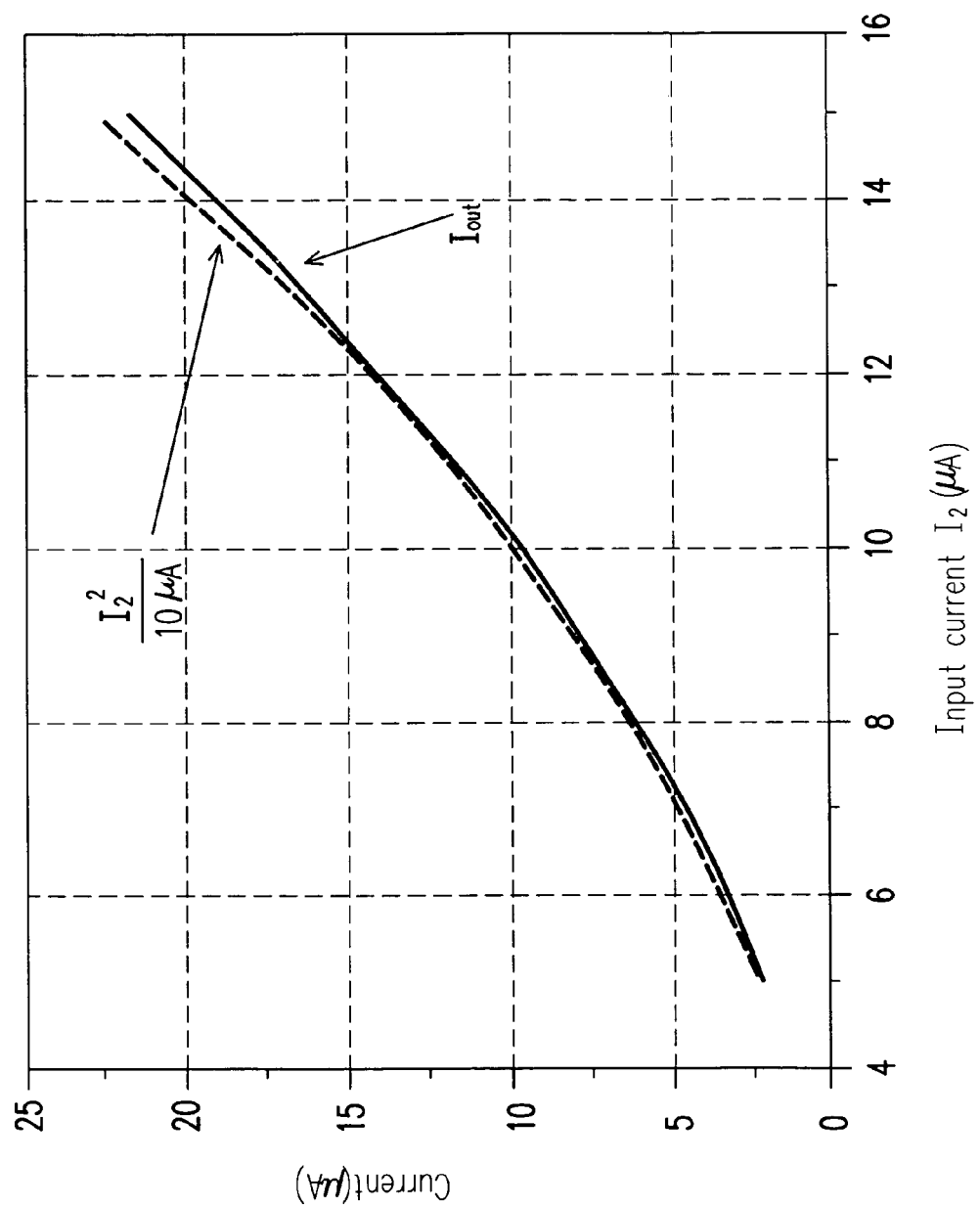
FIG. 3 shows simulation result of a square operation function.

FIG. 3 is the simulation result of the square operation function. At this time, the current I1 is fixed at 10 μA, the current I2 ranges from 5 μA to 15 μA. The solid line 302 of FIG. 3 is $I_{out}$, which is the output current of the circuit. The dash line 301 of FIG. 3 is the ideal result of $$\frac{I_2^2}{10\mu A}.$$

Those output results are very close to the correct square results shown in the curve chart.

Figure 4:
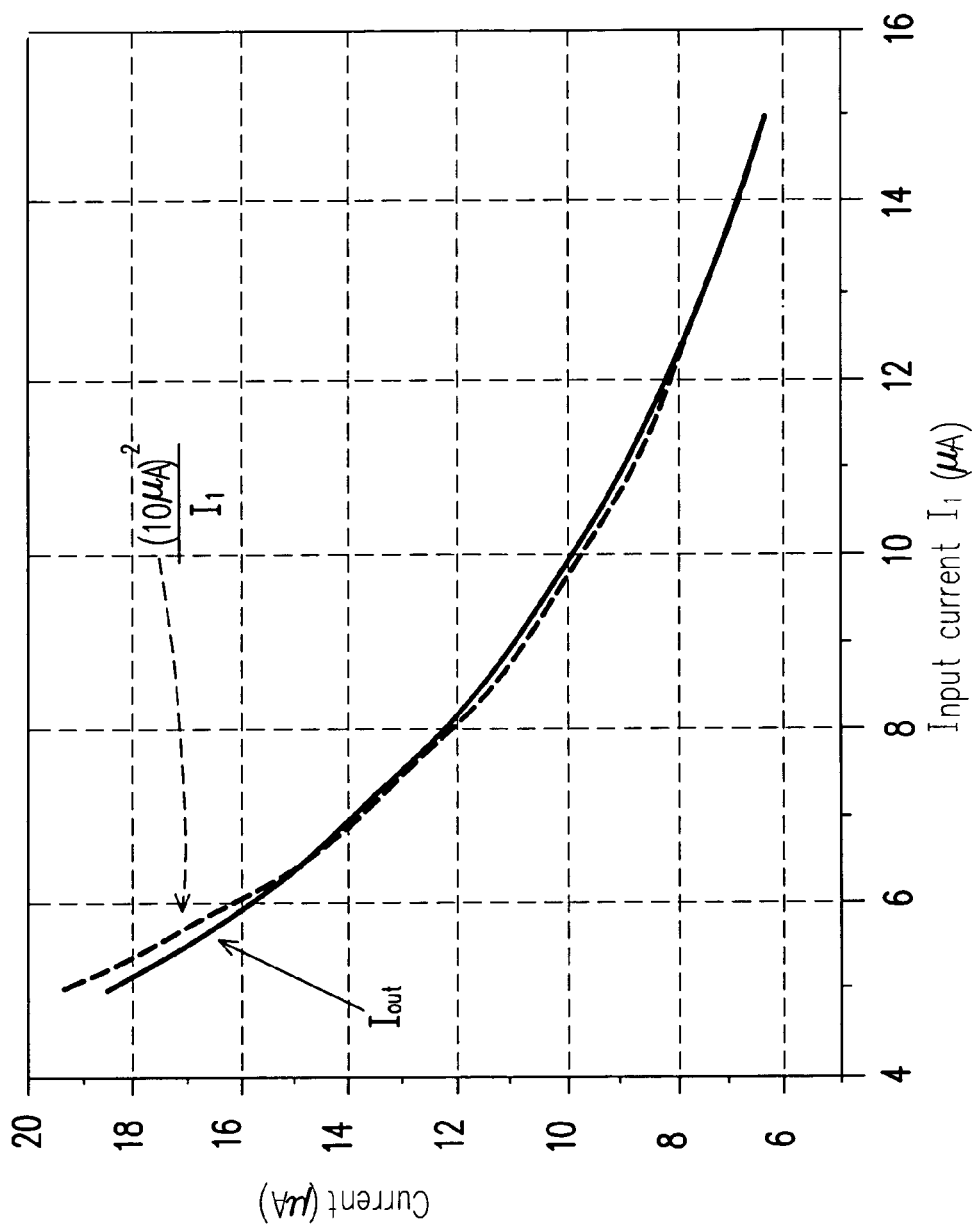
FIG. 4 shows simulation result of a reciprocal operation function.

FIG. 4 is the simulation result of the reciprocal operation function. At this time, the current I2 is fixed at 10 μA, the current I1 ranges from 5 μA to 15 μA. The solid line 402 of FIG. 4 is $I_{out}$, which is the output current of the circuit. The dash line 401 of FIG. 4 is the ideal result of $$\frac{(10\mu A)^2}{I_1}.$$

Those output results are very close to the correct reciprocal results shown in the curve chart.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. An analog circuit for calculating square and reciprocal of a current, comprising:
   a first PMOS transistor, having a drain, a gate and a source, said gate of said first PMOS transistor being coupled to a ground terminal;
   a second PMOS transistor, having a drain, a gate and a source, said source of said second PMOS transistor being coupled to said drain of said first PMOS transistor and said gate of said second PMOS transistor being coupled to said gate of said first PMOS transistor and to said ground terminal;
   a first PNP BJT, having an emitter, a base and a collector, said base and said collector of said first PNP BJT being coupled to said ground terminal and said emitter of said first PNP BJT being coupled to said source of said first PMOS transistor;
   a second PNP BJT, having an emitter, a base and a collector, said base and said collector of said second PNP BJT being coupled to said ground;
   a third PNP BJT having an emitter, a base, and a collector, said base and said collector of said third PNP BJT being coupled to said ground terminal, said emitter of said third PNP BJT being coupled to said drain of said second PMOS transistor;
   a high gain differential operational amplifier, having a positive input terminal, a negative input terminal and an output terminal, said positive input terminal being coupled to said source of said second PMOS transistor and said negative input terminal being coupled to said emitter of said second PNP BJT;
   a third PMOS transistor, having a drain, a gate and a source, said drain of said third PMOS transistor being coupled to said drain of said second PMOS transistor and said gate of said third PMOS transistor being coupled to said output terminal of said high gain differential operational amplifier;
   a first current source, coupled to said source of said first PMOS transistor and said source of said third PMOS transistor; and
   a second current source, coupled to said emitter of said second PNP BJT and said source of said third PMOS transistor.

2. The analog circuit of claim 1, further comprising:
   a first capacitor, having a first terminal and a second terminal, said first and second terminals of said first capacitor being coupled to said source and said drain of said second PMOS transistor respectively to reduce any unexpected vibration; and
   a fourth PMOS transistor, having a drain, a gate and a source, said source of said fourth PMOS transistor being coupled to said source of said third PMOS transistor and said gate of said fourth PMOS transistor being coupled to said gate of said third PMOS transistor.

3. The analog circuit of claim 2, wherein an output current from said drain of said fourth PMOS transistor reflects from an output current from said drain of said third PMOS transistor based on a specific ratio factor.

4. The analog circuit of claim 2, wherein said first current source is 10 μA; said second current source ranges from 5 μA to 15 μA; said output current from said drain of said fourth PMOS transistor is substantially equal to (said second current source)²/10 μA.

5. The analog circuit of claim 2, wherein said second current source is 10 μA; said first current source ranges from 5 μA to 15 μA; said output current from said drain of said fourth PMOS transistor is substantially equal to (10 μA)²/said first current source.

6. The analog circuit of claim 1, wherein said high gain differential operational amplifier includes:
   a fifth PMOS transistor, having a drain, a gate and a source, said gate of said fifth PMOS transistor being coupled to said negative input terminal of said high gain differential operational amplifier;
   a sixth PMOS transistor, having a drain, a gate and a source, said gate of said sixth PMOS transistor being coupled to said positive input terminal of said high gain differential operational amplifier and said source of said sixth PMOS transistor being coupled to said source of said fifth PMOS transistor;
   a seventh PMOS transistor, having a drain, a gate and a source, said drain of said seventh PMOS transistor being coupled to said source of said fifth PMOS transistor;
   an eighth PMOS transistor having a drain, a gate and a source, said gate of said eighth PMOS transistor being coupled to said gate of said seventh PMOS transistor, said source of said eighth PMOS transistor being coupled to said source of said seventh PMOS transistor and said drain of said eighth PMOS transistor being coupled to said output terminal of said high gain differential operational amplifier;
   a first long channel transistor, having a drain, a gate and a source, said source of said first long channel transistor being coupled to said ground and said drain of said first long channel transistor being coupled to said gate of said first long channel transistor and to said drain of said fifth PMOS transistor;
   a second long channel transistor, having a drain, a gate and a source, said gate of said second long channel transistor being coupled to said gate of said first long channel transistor, said source of said second long channel transistor being coupled to said ground and said drain of said second long channel transistor being coupled to said drain of said sixth PMOS transistor;

a third long channel transistor, having a drain, a gate and a source, said gate of said third long channel transistor being coupled to said drain of said second long channel transistor, said source of said third long channel transistor being coupled to said ground and said drain of said third long channel transistor being coupled to said drain of said eighth PMOS transistor;

a resistor, having a first terminal and a second terminal, said first terminal of said resistor being coupled to said drain of said second long channel transistor; and a second capacitor, having a first terminal and a second terminal, said first terminal of said second capacitor being coupled to said second terminal of said resistor and said second terminal of said second capacitor being coupled to said drain of said third long channel transistor.

7. The analog circuit of claim 6, wherein said resistor and said capacitor are adapted for frequency compensation to stabilize said high gain differential operational amplifier.

8. The analog circuit of claim 6, wherein said first, second, and third long channel transistors are adapted for reducing the mismatch and offset.

* * * * *